United States Patent
Yu

(10) Patent No.: US 6,562,665 B1
(45) Date of Patent: May 13, 2003

(54) FABRICATION OF A FIELD EFFECT TRANSISTOR WITH A RECESS IN A SEMICONDUCTOR PILLAR IN SOI TECHNOLOGY

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 226 days.

(21) Appl. No.: 09/688,903

(22) Filed: Oct. 16, 2000

(51) Int. Cl.[7] .............................................. H01L 21/84
(52) U.S. Cl. ........................ 438/149; 438/151; 438/589; 438/592
(58) Field of Search .............................. 438/149, 151, 438/152, 161, 164, 197, 301, 585, 589, 592, 595, 596

(56) References Cited

U.S. PATENT DOCUMENTS

| | | | | |
|---|---|---|---|---|
| 604,878 | A | * | 5/1898 | Francisco ..................... 30/411 |
| 5,773,331 | A | * | 6/1998 | Soloman et al. ............ 438/164 |
| 6,060,746 | A | * | 5/2000 | Bertin et al. ................ 257/331 |
| 6,255,204 | B1 | * | 7/2001 | Tobin et al. ................ 438/592 |
| 6,362,034 | B1 | * | 3/2002 | Sandford et al. ........... 438/197 |

OTHER PUBLICATIONS

Xuejue Huang et al., *Sub 50–nm FinFET: PMOS*, IEDM, 1999.

* cited by examiner

*Primary Examiner*—Don Wong
*Assistant Examiner*—Thuy Vinh Tran
(74) *Attorney, Agent, or Firm*—Monica H. Choi

(57) ABSTRACT

For fabricating a field effect transistor, a pillar of semiconductor material is formed, a recess is formed in the top surface of the pillar along the length of the pillar, a gate dielectric material is deposited on any exposed surface of the semiconductor material of the pillar including at the top surface and the first and second side surfaces of the pillar and at the sidewalls and the bottom wall of the recess, for a gate length along the length of the pillar. In addition, a gate electrode material is deposited on the gate dielectric material to surround the pillar at the top surface and the first and second side surfaces of the pillar and to fill the recess, for the gate length of the pillar. A drain and source dopant is implanted into exposed regions of the pillar to form a drain of the field effect transistor on a first side of the gate electrode material along the length of the pillar and to form a source of the field effect transistor on a second side of the gate electrode material along the length of the pillar.

16 Claims, 6 Drawing Sheets

FABRICATION OF A FIELD EFFECT TRANSISTOR WITH A RECESS IN A SEMICONDUCTOR PILLAR IN SOI TECHNOLOGY

TECHNICAL FIELD

The present invention relates generally to fabrication of field effect transistors having scaled-down dimensions, and more particularly, to fabrication of a field effect transistor with a recess along a length of a semiconductor pillar in SOI (semiconductor on insulator) technology for minimizing short-channel effects and for maximizing drive current for the field effect transistor having scaled down dimensions of tens of nanometers.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, short-channel effects degrade the performance of the MOSFET 100. Short-channel effects that result due to the short length of the channel between the drain extension 104 and the source extension 106 of the MOSFET 100 are known to one of ordinary skill in the art of integrated circuit fabrication. The electrical characteristics of the MOSFET 100 become difficult to control with bias on the gate electrode 118 with short-channel effects which may severely degrade the performance of the MOSFET.

Referring to FIG. 2, to enhance the control of electrical characteristics of a MOSFET 200, a three-sided gate electrode 202 is formed to surround a pillar 204 of semiconductor material for the MOSFET 200 formed with SOI (semiconductor on insulator) technology.

FIG. 3 shows the cross sectional view of the three-sided gate electrode 202 across line A—A in FIG. 2. The pillar 204 of semiconductor material is formed on a layer of buried insulating material 206 on a semiconductor substrate 208 in SOI (semiconductor on insulator) technology, as known to one of ordinary skill in the art of integrated circuit fabrication. Typically, the semiconductor substrate 208 and the pillar 204 are comprised of silicon, and the three-sided gate electrode 202 is comprised of polysilicon. In addition, the layer of buried insulating material 206 is comprised of silicon dioxide ($SiO_2$).

A three-sided gate dielectric 210 is formed between the pillar 204 and the three sided gate electrode 202. The three-sided gate dielectric 210 is comprised of one of silicon dioxide ($SiO_2$), silicon nitride (Si3N4), or a dielectric material such as a metal oxide with a dielectric constant that is higher than the dielectric constant of silicon dioxide ($SiO_2$).

A drain and source dopant is implanted into the pillar 204 at a first side of the three-sided gate electrode 202 to form a drain 212 of the MOSFET 200 and at a second side of the three-sided gate electrode 202 to form a source 214 of the MOSFET 200. A drain contact pad 216 is formed to provide connection to the drain 212 of the MOSFET 200, and a source contact pad 218 is formed to provide connection to the source 214 of the MOSFET 200.

Referring to FIGS. 2 and 3, the channel region of the MOSFET 200 is the gate length of the pillar 204 between the drain 212 and the source 214 and covered by the three-sided gate electrode 202. Because charge accumulation within such a channel region is controlled by bias on the gate electrode 202 on three surfaces of the pillar (instead of just the one top surface of the semiconductor substrate 102 in the conventional MOSFET of FIG. 1), electrical characteristics of the MOSFET 200 formed with SOI technology is more controllable to compensate for short-channel effects of the MOSFET 200.

However, the effective drive current width of the MOSFET 200 may be limited. FIG. 4 shows the cross-sectional view of the pillar 204 of FIG. 3 with the pillar 204 and the gate dielectric 210 enlarged. The drain to source current of the MOSFET 200 is proportional to the effective drive current width of the MOSFET 200. Referring to FIG. 4, the effective drive current width of the MOSFET 200 is the total perimeter distance of the gate dielectric 210 surrounding the pillar 204 including the height 220 of the pillar 204 for the first and second sides of the pillar 204 and the width 222 of the pillar 204 for the top surface of the pillar 204. If "H" denotes the height 220 of the pillar 204 and "W" denotes the width 222 of the pillar 204, then the effective drive current width "$W_{eff}$" of the MOSFET 200 is as follows:

$$W_{eff} = W + 2 \times H$$

However, as the dimensions of the MOSFET 200 are scaled down for a smaller gate length of the pillar 204 from the drain contact 216 to the source contact 218, etching processes have aspect ratio limitations such that the height 220 of the pillar 204 is limited, as known to one of ordinary skill in the art of integrated circuit fabrication. With a limited height 220 of the pillar 204, the effective drive current width, $W_{eff}$, and in turn the speed performance of the MOSFET 200 are disadvantageously limited.

Nevertheless, fabrication of the MOSFET 200 in SOI (semiconductor on insulator) technology with formation of the three-dimensional pillar 204 having gate bias at a plurality of sides of the pillar 204 is desirable for minimizing undesired short-channel effects. Thus, a mechanism is desired for maximizing the effective drive current width, $W_{eff}$, of a MOSFET formed with the three-dimensional pillar having gate bias at a plurality of sides of the pillar 204 in SOI (semiconductor on insulator) technology.

SUMMARY OF THE INVENTION

Accordingly, in a general aspect of the present invention, a pillar of semiconductor material is formed with a recess along the length of the pillar such that gate bias may be applied on more numerous surfaces of the semiconductor pillar to maximize the effective drive current width of a MOSFET.

In one embodiment of the present invention, for fabricating a field effect transistor on a semiconductor substrate in SOI (semiconductor on insulator) technology, a pillar of semiconductor material is formed on a layer of buried insulating material with the pillar having a top surface and first and second side surfaces, and with the pillar having a width, a length, and a height. A recess is formed in the top surface of the pillar along the length of the pillar, and the recess has sidewalls and a bottom wall of the semiconductor material of the pillar. A gate dielectric material is deposited on any exposed surface of the semiconductor material of the pillar including at the top surface and the first and second side surfaces of the pillar and at the sidewalls and the bottom wall of the recess, for a gate length along the length of the pillar. An effective drive current width of the field effect transistor is a total perimeter distance of the gate dielectric material on the top surface and the first and second side surfaces of the pillar and on the sidewalls and the bottom wall of the recess.

In addition, a gate electrode material is deposited on the gate dielectric material to surround the pillar at the top surface and the first and second side surfaces of the pillar and to fill the recess, for the gate length of the pillar. A drain and source dopant is implanted into exposed regions of the pillar to form a drain of the field effect transistor on a first side of the gate electrode material along the length of the pillar and to form a source of the field effect transistor on a second side of the gate electrode material along the length of the pillar.

In one aspect of the present invention, for forming the pillar of semiconductor material, the layer of buried insulating material is deposited on the semiconductor substrate, and a layer of the semiconductor material of the pillar is deposited on the layer of buried insulating material. A layer of masking insulating material is deposited on the layer of semiconductor material, and a layer of photoresist material is patterned and etched to mask the layer of masking insulating material and the layer of the semiconductor material of the pillar for the width and the length of the pillar. Any region of the layer of masking insulating material and the layer of the semiconductor material of the pillar not masked by the photoresist material is etched to form the pillar of the semiconductor material with the masking insulating material on the top surface of the pillar.

In a further aspect of the present invention, for forming the recess in the top surface of the pillar, first spacers are formed on sidewalls of the pillar and on sidewalls of the masking insulating material on the top surface of the pillar. The masking insulating material is etched away from the top surface of the pillar to form a top surface opening on the top surface of the pillar such that the top surface opening has sidewalls of the first spacers. Second spacers are formed on sidewalls of the top surface opening to cover side portions of the top surface of the pillar and to expose a middle portion of the top surface of the pillar. The pillar is etched from the exposed middle portion of the top surface of the pillar down to a depth that is about ½ the height of the pillar to form the recess within the pillar. The first spacers and the second spacers are then etched away.

The present invention may be used to particular advantage when the semiconductor material of the pillar is silicon, when the first spacers are comprised of silicon dioxide ($SiO_2$), when the second spacers are comprised of silicon nitride ($Si_3N_4$), and when the layer of masking insulating material is comprised of silicon nitride ($Si_3N_4$).

In this manner, the gate dielectric material contacts more numerous surfaces of the semiconductor pillar including at the top surface and the side surfaces of the pillar, and the sidewalls and the bottom wall of the recess. Thus, the effective drive current width of the field effect transistor is increased. In addition, since gate bias on the gate electrode is applied on the more numerous surfaces of the semiconductor pillar including at the top surface and the side surfaces of the pillar, and the sidewalls and the bottom wall of the recess, the short-channel effects of the field effect transistor are minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, and 18 refer to elements having similar structure and function.

DETAILED DESCRIPTION

Figure 5:
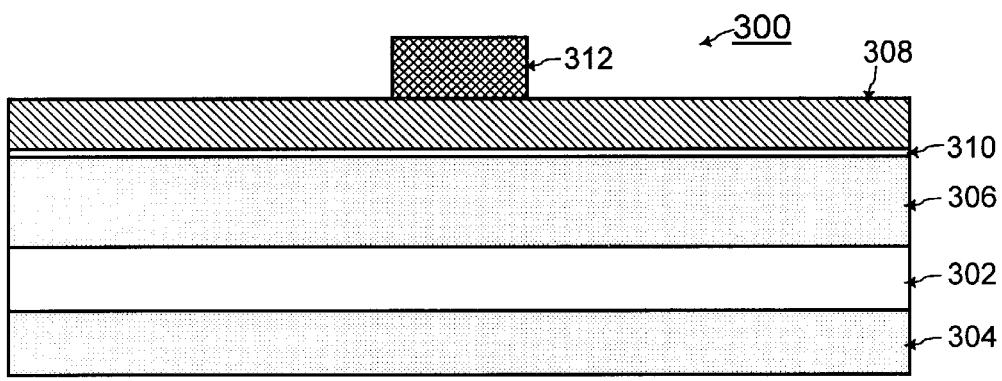
FIGS. 5, 6, 7, 8, 9, 10, 11, 12, 13, 14, 15, 16, 17, and 18 show isometric and cross-sectional views for illustrating the steps for fabricating a MOSFET (Metal Oxide Semiconductor Field Effect Transistor) with a semiconductor pillar having a recess along the length of the pillar such that gate bias is applied on more numerous surfaces of the semiconductor pillar to maximize the effective drive current width of the MOSFET while minimizing short-channel effects of the MOSFET.

Referring to FIG. 5, for fabricating a MOSFET 300 in SOI (semiconductor on insulator) technology, a layer of buried insulating material 302 is formed on a semiconductor substrate 304. The semiconductor substrate 304 is typically comprised of silicon, and the layer of buried insulating material 302 is typically comprised of silicon dioxide ($SiO_2$). A layer of semiconductor material 306 for forming a pillar is deposited on the layer of buried insulating material 302. The layer of semiconductor material 306 is comprised of silicon according to an embodiment of the present invention. Processes for deposition of the layer of buried insulating material 302 and the layer of semiconductor material 306 are known to one of ordinary skill in the art of integrated circuit fabrication.

A layer of masking insulating material 308 is deposited on the layer of semiconductor material 306. In one embodiment of the present invention, the layer of masking insulating material 308 is comprised of silicon nitride ($Si_3N_4$). In that case, a buffer layer of silicon dioxide ($SiO_2$) 310 is deposited between the layer of semiconductor material 306 and the layer of masking insulating material 308 to provide a smoother transition between the layer of semiconductor material 306 and the layer of masking insulating material 308. In that case, the buffer layer of silicon dioxide ($SiO_2$) 310 has a thickness in a range of from about 50 Å (angstroms) about 150 Å (angstroms), and the layer of masking insulating material 308 has a thickness in a range of from about 30 nanometers to about 60 nanometers in an embodiment of the present invention. Processes for deposition of the layer of masking insulating material 308 and the buffer layer of silicon dioxide ($SiO_2$) 310 are known to one of ordinary skill in the art of integrated circuit fabrication.

Figure 6:
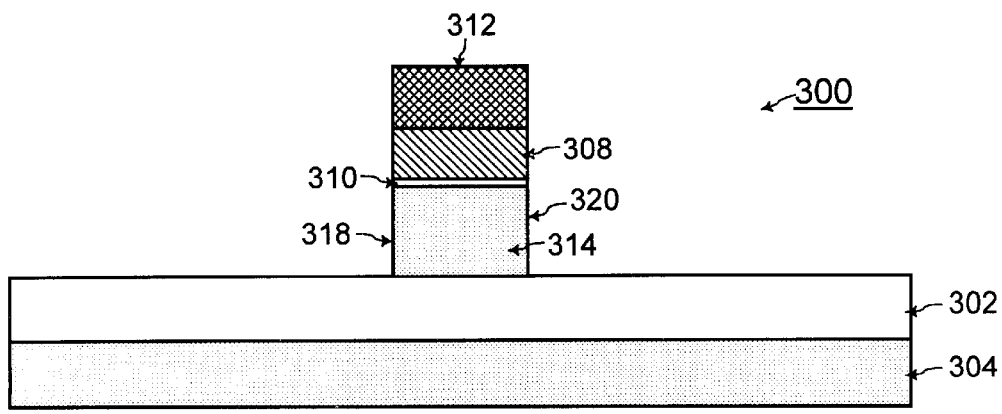

Further referring to FIG. 5, a layer of photoresist material 312 is deposited and patterned to have a width and a length of a pillar to be formed from the layer of semiconductor material 306. Referring to FIGS. 5 and 6, any region of the layer of masking insulating material 308, the buffer layer of silicon dioxide ($SiO_2$) 310, and the layer of semiconductor material 306 not masked by the photoresist material 312 is etched away to form a pillar 314 of the semiconductor material 306. Processes for patterning and etching the layer of masking insulating material 308, the buffer layer of silicon dioxide ($SiO_2$) 310, and the layer of semiconductor material 306 are known to one of ordinary skill in the art of integrated circuit fabrication.

Figure 7:
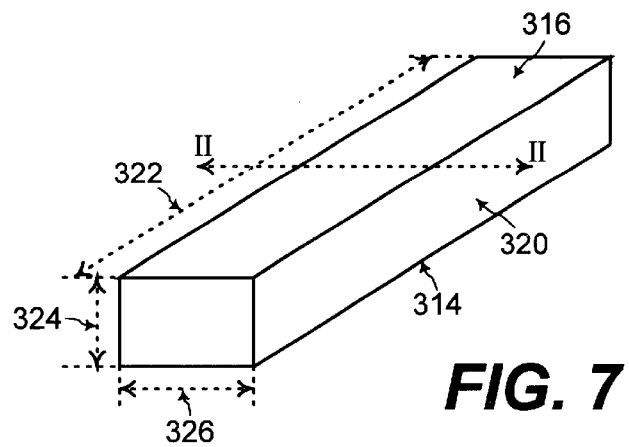

FIG. 7 shows an isometric view of the pillar of semiconductor material 314. Referring to FIGS. 6 and 7, the pillar 314 of the semiconductor material 306 has a top surface 316, and a first side surface 318 and a second side surface 320. The cross-sectional view of the pillar 314 of FIG. 6 is across the dashed line B—B in FIG. 7. Further referring to FIG. 7, the pillar 314 has a length 322, a height 324, and a width 326. In one embodiment of the present invention, the height 324 of the pillar 314 is in a range of from about 50 nanometers to about 80 nanometers, and the width 326 of the pillar 314 is in a range of from about 30 nanometers to about 60 nanometers.

Figure 8:
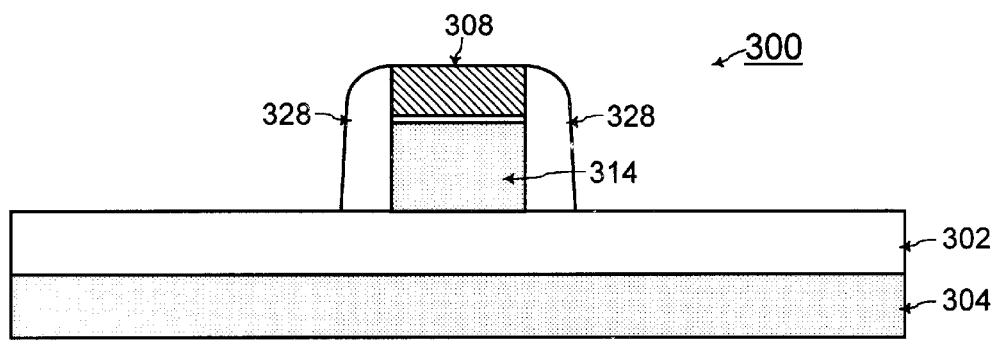

Referring to FIG. 6, the pillar 314 has the silicon dioxide ($SiO_2$) of the buffer layer 310 and the silicon nitride ($Si_3N_4$) of the layer of masking insulating material 308 remaining on the top surface 316 of the pillar 314. Referring to FIGS. 6 and 8, the photoresist material 312 is removed from the masking insulating material 308 remaining on the top surface 316 of the pillar 314. For forming a recess along the length of the pillar 314 from the top surface 316 of the pillar 314, referring to FIG. 8, first spacers 328 are deposited on the side surfaces 318 and 320 of the pillar 314 and of the masking insulating material 308 on the top surface 316 of the pillar 314. In one embodiment of the present invention, the first spacers 328 are comprised of silicon dioxide ($SiO_2$), and processes for formation of such spacers 328 are known to one of ordinary skill in the art of integrated circuit fabrication.

Figure 9:
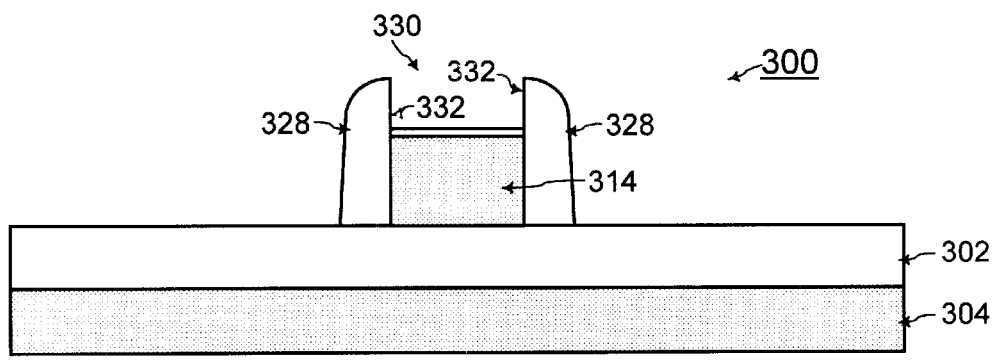

Referring to FIG. 9, the masking insulating material 308 is etched away from the top surface 316 of the pillar 314. In an embodiment of the present invention, the masking insulating material 308 is comprised of silicon nitride ($Si_3N_4$), and the first spacers 328 are comprised of silicon dioxide ($SiO_2$), such that the masking insulating material 308 is selectively etched away while the first spacers 328 are preserved. Processes for selectively etching away the masking insulating material 308 are known to one of ordinary skill in the art of integrated circuit fabrication.

Figure 10:
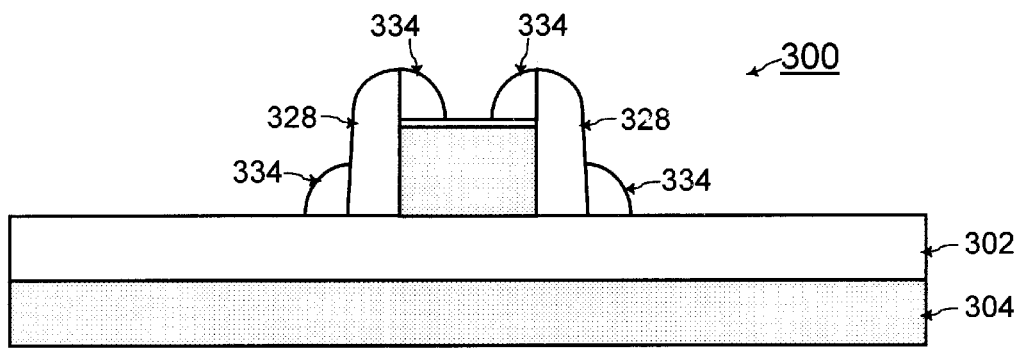

Further referring to FIG. 9, when the masking insulating material 308 is etched away from the top surface 316 of the pillar 314, a top surface opening 330 is formed to have sidewalls 332 of the first spacers 328. Referring to FIGS. 9 and 10, second spacers 334 are formed on the sidewalls 332 of the top surface opening 330 to covers side portions of the top surface 316 of the pillar 314 and to expose a middle portion of the top surface 316 of the pillar 314 not covered by the second spacers 334, as illustrated in FIG. 10. The second spacers 334 may also form at the sides of the first spacers 228 on the buried insulating material 302.

When the first spacers 328 are comprised of silicon dioxide ($SiO_2$), the second spacers 334 are comprised of silicon nitride ($Si_3N_4$) such that the first spacers 328 are preserved during formation of the second spacers 334. In that case, the silicon dioxide ($SiO_2$) remaining on the top surface 316 of the pillar 314 provides a smoother transition between the second spacers 334 of silicon nitride ($Si_3N_4$) and the pillar 314 which may be comprised of silicon. Processes for formation of such second spacers 334 are known to one of ordinary skill in the art of integrated circuit fabrication.

Figure 11:
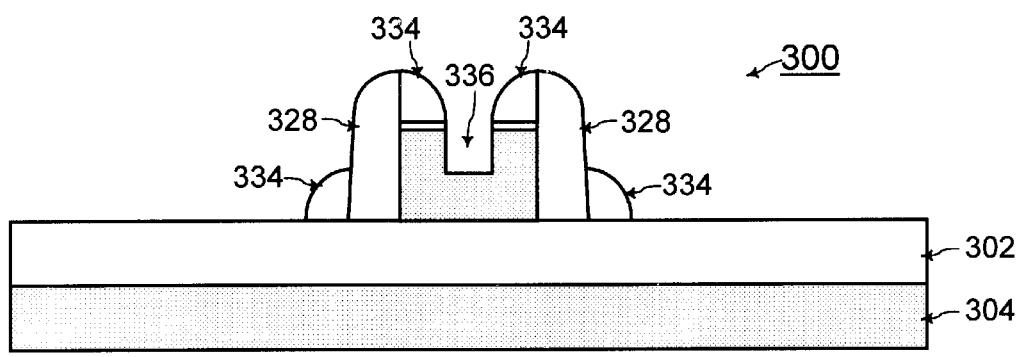

Referring to FIGS. 10 and 11, the pillar 314 is etched from the exposed middle portion of the top surface 316 of the pillar 314 not covered by the second spacers 334 to form a recess 336 in the pillar 314. The recess 336 of the pillar 314 is formed to have a depth from the top surface 316 of the pillar 314 that is about ½ the height 324 of the pillar 314. In an embodiment of the present invention, when the width 326 of the pillar 314 is in a range of from about 30 nanometers to about 60 nanometers, the second spacers 334 have a width in a range of from about 10 nanometers to about 20 nanometers such that the width of the recess 336 is about ⅓ the width 326 of the pillar 314. Processes for etching the semiconductor material such as silicon of the pillar 314 to form the recess 336 are known to one of ordinary skill in the art of integrated circuit fabrication.

Figure 12:
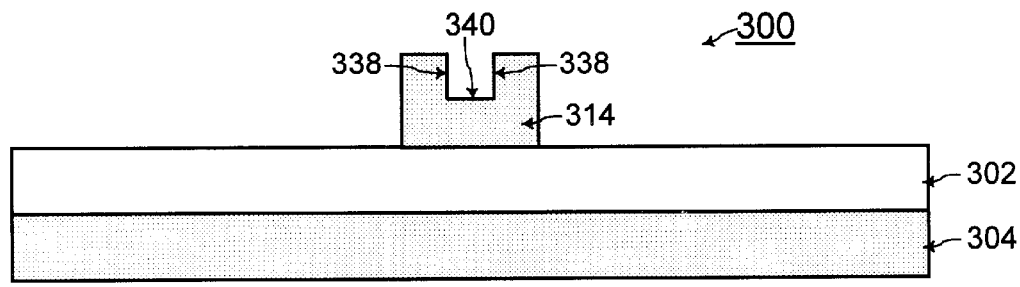
Figure 13:
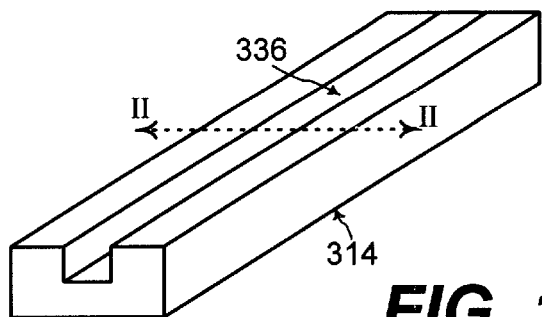

Referring to FIG. 12, after formation of the recess 336 in the pillar 314, the first spacers 328, the second spacers 334, and the silicon dioxide of the buffer insulating material 310 are etched away to leave the pillar 314 on the buried insulating material 302. Processes for etching away the first spacers 328, the second spacers 334, and the silicon dioxide of the buffer insulating material 310 are known to one of ordinary skill in the art of integrated circuit fabrication. FIG. 13 shows an isometric view of the pillar 314 with the recess 336 along the length 322 of the pillar 314. The cross-sectional view of FIG. 12 is along the dashed line B—B of FIG. 13. The recess 336 has sidewalls 338 and a bottom wall 340 of the semiconductor material of the pillar 314.

Figure 14:
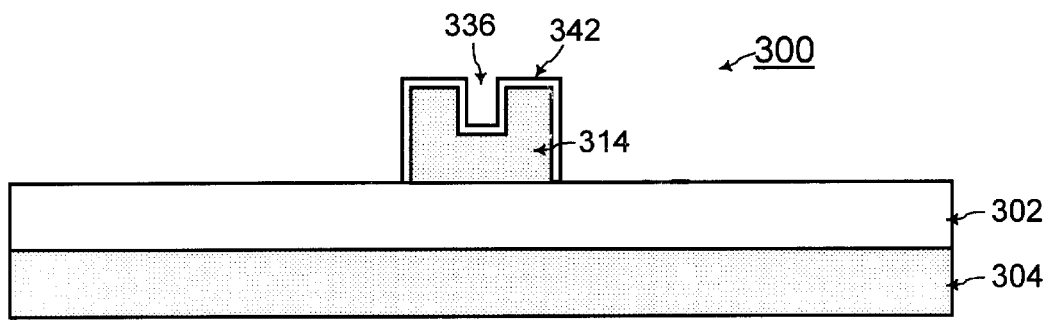

For forming the MOSFET 300 from the pillar 314, referring to FIG. 14, a gate dielectric material 342 is deposited on any exposed surfaces of the pillar 314 including the top surface 316 and the side surfaces 318 and 320 of the pillar 314 and the sidewalls 338 and the bottom wall 340 of the recess 336. The gate dielectric material may be comprised of one of silicon dioxide (SiO$_2$) or silicon nitride (Si$_3$N$_4$) in one embodiment of the present invention. In another embodiment of the present invention, the gate dielectric material 342 is comprised of a material such as a metal oxide that has a dielectric constant that is higher than the dielectric constant of silicon dioxide (SiO$_2$). In that case, the gate dielectric material 342 has a higher thickness than if the gate dielectric material 342 were comprised of silicon dioxide (SiO$_2$) to minimize undesired tunneling current through the gate dielectric material 342. Processes for deposition of such gate dielectric material 342 are known to one of ordinary skill in the art of integrated circuit fabrication.

Figure 15:
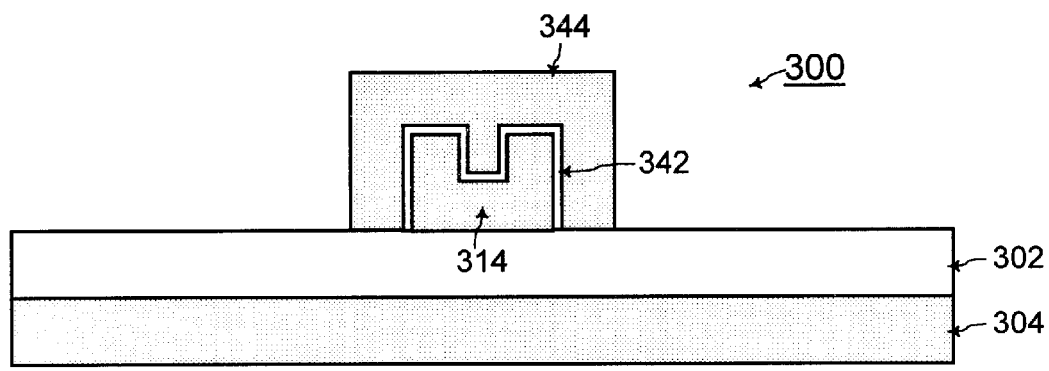

Referring to FIG. 15, a gate electrode material 344 is deposited on the gate dielectric material 342 to surround the pillar 314 at the top surface 316 and the side surfaces 318 and 320 of the pillar 314 and the sidewalls 338 and the bottom wall 340 of the recess 336. According to one embodiment of the present invention, the gate electrode material 344 is comprised of one of poly-silicon, poly-silicon germanium (SiGe), or a metal with a thickness in a range of from about 50 nanometers to about 200 nanometers. Processes for deposition of such gate electrode material 344 are known to one of ordinary skill in the art of integrated circuit fabrication.

Figure 16:
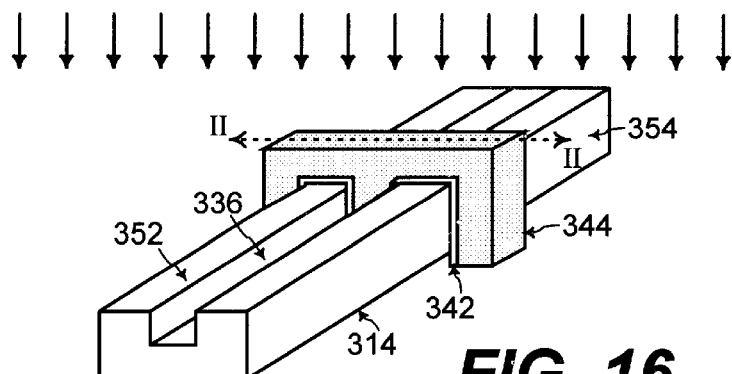

FIG. 16 shows an isometric view of the pillar 314 with the gate dielectric material 342 and the gate electrode material 344 patterned to surround the pillar 314 for a gate length of the length 322 of the pillar. The remaining length of the pillar 314 not surrounded by the gate electrode material 344 is exposed. The cross-sectional view of FIG. 15 is along the dashed line B—B in FIG. 16.

Further referring to FIG. 16, a drain and source dopant is implanted into the exposed regions of the pillar 314 to form a drain 352 of the MOSFET 300 at a first side of the gate electrode material 344 along the length 322 of the pillar 314 and to form a source 354 of the MOSFET 300 at a second side of the gate electrode material 344 along the length 322 of the pillar 314. The drain and source dopant is an N-type dopant for forming the drain 352 and the source 354 of an NMOSFET (N-channel Metal Oxide Semiconductor Field Effect Transistor). Alternatively, the drain and source dopant is a P-type dopant for forming the drain 252 and the source 254 of a PMOSFET (P-channel Metal Oxide Semiconductor Field Effect Transistor). Processes for implantation of the drain and source dopant for formation of the drain 252 and the source 254 are known to one of ordinary skill in the art of integrated circuit fabrication.

Figure 17:
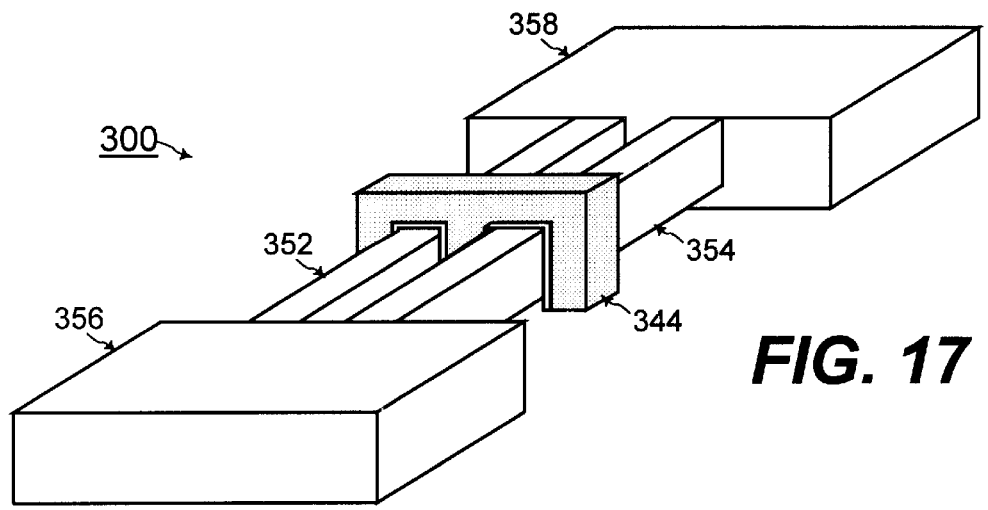

Referring to FIG. 17, a drain contact pad 356 is formed to contact the drain 352 to provide connection to the drain of the MOSFET 300, and a source contact pad 358 is formed to contact the source 354 to provide connection to the source of the MOSFET 300. Processes for formation of the contact pads 356 and 358 are known to one of ordinary skill in the art of integrated circuit fabrication.

Figure 1:
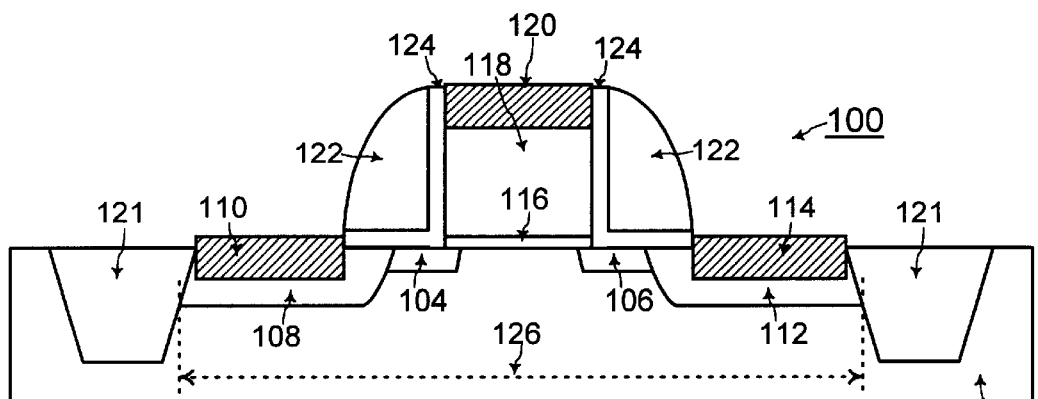
FIG. 1 shows a cross-sectional view of a conventional MOSFET (Metal Oxide Semiconductor Field Effect Transistor) with the gate electrode disposed over a single surface of the semiconductor substrate.
Figure 2:
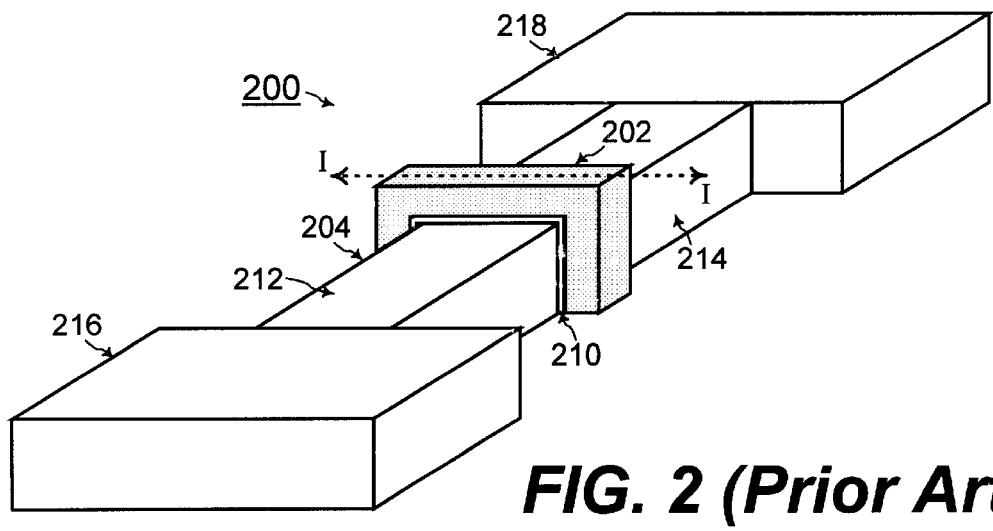
FIG. 2 shows an isometric view of a MOSFET (Metal Oxide Semiconductor Field Effect Transistor) fabricated in SOI (semiconductor on insulator) technology with a three-sided gate electrode surrounding three surfaces of a silicon pillar, according to the prior art.
Figure 3:
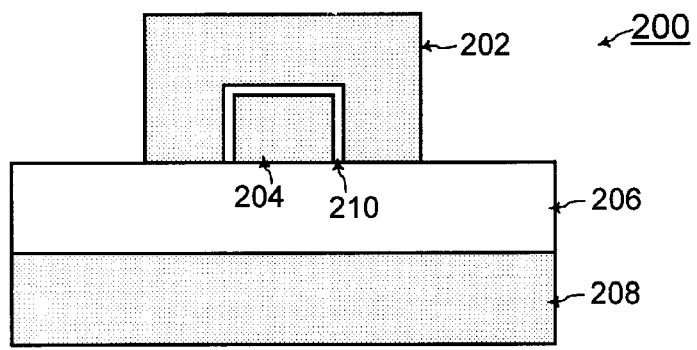
FIG. 3 shows a cross sectional view of the three-sided gate electrode surrounding three surfaces of the silicon pillar of FIG. 2.
Figure 4:
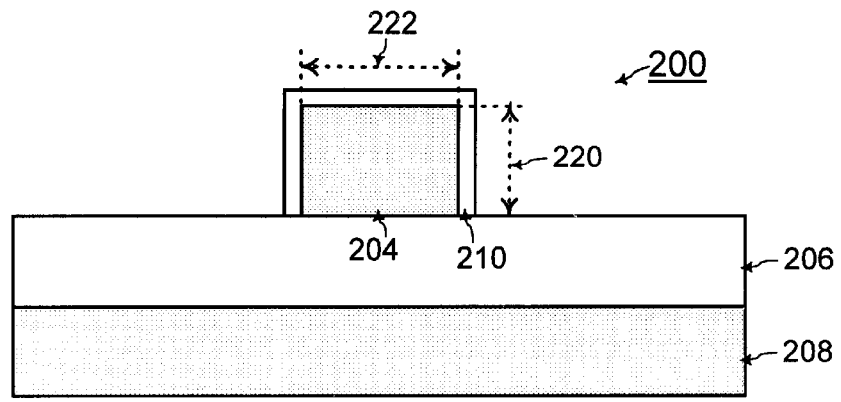
FIG. 4 shows the cross sectional view of FIG. 3 with a three-sided gate dielectric surrounding the three surfaces of the silicon pillar of FIG. 3 for illustrating that the effective drive current width of the MOSFET is limited by the height of the silicon pillar.
Figure 18:
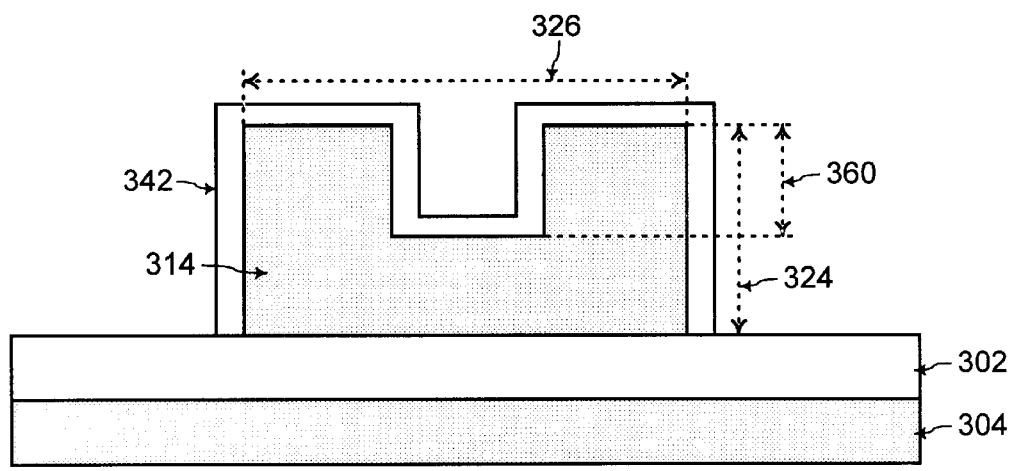

In this manner, with formation of the recess 336 in the pillar 314, the gate dielectric material 342 contacts more numerous surfaces of the semiconductor pillar 314 including at the top surface 316 and the side surfaces 318 and 320 of the pillar 314, and the sidewalls 338 and the bottom wall 340 of the recess 336. Referring to FIG. 18, the effective drive current width $W_{eff}'$ is the total perimeter distance of the gate dielectric material on the pillar 314. For the pillar 314 of an aspect of the present invention of FIG. 18, the effective drive current width $W_{eff}'$ is expressed as follows:

$$W_{eff}'=W+2\times H+2\times D,$$

where "W" is the width 326 of the pillar 314, "H" is the height 324 of the pillar 314, and "D" is the depth 360 of the recess 336. Comparing the pillar 204 of the prior art in FIG. 3 having the effective drive current width "$W_{eff}=W+2\times H$", the effective drive current width "$W_{eff}'=W+2\times H+2\times D$" of the MOSFET 300 of the present invention is increased by "2×D". With an increase of the effective drive current width, the drain to source current of the MOSFET 300 is increased to enhance the speed performance of the MOSFET 300.

In addition, since gate bias on the gate electrode 344 is applied on the more numerous surfaces of the semiconductor pillar including at the top surface 316 and the side surfaces 318 and 320 of the pillar 314, and the sidewalls 338 and the bottom wall 340 of the recess 336, charge accumulation in the channel region of the MOSFET 300 is more controlled such that the short-channel effects of the MOSFET 300 are minimized. Furthermore, because the MOSFET 300 is formed with SOI (semiconductor on insulator) technology, junction capacitance is eliminated to further enhance the speed performance of the MOSFET.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "side," "bottom," and "on" as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for fabricating a field effect transistor on a semiconductor substrate in SOI (semiconductor on insulator) technology, the method including the steps of:

A. forming a pillar of semiconductor material on a layer of buried insulating material, wherein said pillar has a top surface and first and second side surfaces, and wherein said pillar has a width, a length, and a height;

B. forming a recess in said top surface of said pillar along said length of said pillar, wherein said recess has sidewalls and a bottom wall of said semiconductor material of said pillar;

C. depositing a gate dielectric material on any exposed surface of said semiconductor material of said pillar including at said top surface and said first and second side surfaces of said pillar and at said sidewalls and said bottom wall of said recess, for a gate length along said length of said pillar, wherein an effective drive current width of said field effect transistor is a total perimeter distance of said gate dielectric material on said top surface and said first and second side surfaces of said pillar and on said sidewalls and said bottom wall of said recess;

D. depositing a gate electrode material on said gate dielectric material to surround said pillar at said top surface and said first and second side surfaces of said pillar and to fill said recess, for said gate length of said pillar; and E. implanting a drain and source dopant into exposed regions of said pillar to form a drain of said field effect transistor on a first side of said gate electrode material along said length of said pillar and to form a source of said field effect transistor on a second side of said gate electrode material along said length of said pillar.

2. The method of claim 1, wherein said step A includes the steps of:

depositing said layer of buried insulating material on said semiconductor substrate;

depositing a layer of said semiconductor material of said pillar on said layer of buried insulating material;

depositing a layer of masking insulating material on said layer of semiconductor material;

patterning and etching a layer of photoresist material to mask said layer of masking insulating material and said layer of said semiconductor material of said pillar for said width and said length of said pillar; and etching any region of said layer of masking insulating material and said layer of said semiconductor material of said pillar not masked by said photoresist material to form said pillar of said semiconductor material with said masking insulating material on said top surface of said pillar.

3. The method of claim 2, wherein said layer of masking insulating material is comprised of silicon nitride ($Si_3N_4$), and wherein a buffer layer of silicon dioxide ($SiO_2$) is deposited between said layer of semiconductor material of said pillar and said layer of masking insulating material.

4. The method of claim 3, wherein said buffer layer of silicon dioxide ($SiO_2$) has a thickness in a range of from about 50 Å (angstroms) about 150 Å (angstroms), and wherein said layer of masking insulating material has a thickness in a range of from about 30 nanometers to about 60 nanometers.

5. The method of claim 2, wherein said step B includes the steps of:

forming first spacers on sidewalls of said pillar and on sidewalls of said masking insulating material on said top surface of said pillar;

etching away said masking insulating material from said top surface of said pillar to form a top surface opening on said top surface of said pillar, wherein said top surface opening has sidewalls of said first spacers;

forming second spacers on sidewalls of said top surface opening to cover side portions of said top surface of said pillar and to expose a middle portion of said top surface of said pillar;

etching said pillar from said exposed middle portion of said top surface of said pillar down to a depth that is about ½ the height of said pillar to form said recess within said pillar; and etching away said first spacers and said second spacers.

6. The method of claim 5, wherein said first spacers are comprised of silicon dioxide ($SiO_2$).

7. The method of claim 6, wherein said second spacers are comprised of silicon nitride ($Si_3N_4$) having a width in a range of from about 10 nanometers to about 20 nanometers.

8. The method of claim 1, wherein said semiconductor material of said pillar is silicon.

9. The method of claim 8, wherein said height of said semiconductor pillar is in a range of from about 50 nanometers to about 80 nanometers, and wherein said width of said semiconductor pillar is in a range of from about 30 nanometers to about 60 nanometers.

10. The method of claim 1, wherein said gate dielectric material is comprised of one of silicon dioxide ($SiO_2$) and silicon nitride ($Si_3N_4$).

11. The method of claim 1, wherein said gate dielectric material has a dielectric constant that is higher than the dielectric constant of silicon dioxide ($SiO_2$).

12. The method of claim 1, wherein said gate electrode material is comprised of one of poly-silicon, poly-silicon germanium (SiGe), and a metal.

13. The method of claim 12, wherein said gate electrode material is deposited with a thickness in a range of from about 50 nanometers to about 200 nanometers.

14. The method of claim 1, wherein said drain and source dopant is an N-type dopant for fabrication of an NMOSFET (N-channel Metal Oxide Semiconductor Field Effect Transistor).

15. The method of claim 1, wherein said drain and source dopant is a P-type dopant for fabrication of a PMOSFET (P-channel Metal Oxide Semiconductor Field Effect Transistor).

16. A method for fabricating a MOSFET (metal oxide semiconductor field effect transistor) on a semiconductor substrate in SOI (semiconductor on insulator) technology, the method including the steps of:

A. forming a pillar of semiconductor material on a layer of buried insulating material, wherein said pillar has a top surface and first and second side surfaces, and wherein said semiconductor material of said pillar is silicon, and wherein said pillar has a length, a width in a range of from about 30 nanometers to about 60 nanometers, and a height in a range of from about 50 nanometers to about 80 nanometers, and wherein said step A includes the steps of:

depositing said layer of buried insulating material on said semiconductor substrate;

depositing a layer of said semiconductor material of said pillar on said layer of buried insulating material;

depositing a layer of masking insulating material on said layer of semiconductor material, wherein said layer of masking insulating material is comprised of silicon nitride ($Si_3N_4$) having a thickness in a range of from about 30 nanometers to about 60 nanometers, and wherein a buffer layer of silicon dioxide ($SiO_2$) having a thickness in a range of from about 50 Å (angstroms) about 150 Å (angstroms) is deposited between said layer of semiconductor material of said pillar and said layer of masking insulating material;

patterning and etching a layer of photoresist material to mask said layer of masking insulating material and said layer of said semiconductor material of said pillar for said width and said length of said pillar; and etching any region of said layer of masking insulating material and said layer of said semiconductor material of said pillar not masked by said photoresist material to form said pillar of said semiconductor material with said masking insulating material on said top surface of said pillar;

B. forming a recess in said top surface of said pillar along said length of said pillar, wherein said recess has sidewalls and a bottom wall of said semiconductor material of said pillar, and wherein said step B includes the steps of:

forming first spacers on sidewalls of said pillar and on sidewalls of said masking insulating material on said top surface of said pillar, wherein said first spacers are comprised of silicon dioxide ($SiO_2$);

etching away said masking insulating material from said top surface of said pillar to form a top surface opening on said top surface of said pillar, wherein said top surface opening has sidewalls of said first spacers;

forming second spacers on sidewalls of said top surface opening to cover side portions of said top surface of said pillar and to expose a middle portion of said top surface of said pillar, wherein said second spacers are comprised of silicon nitride ($Si_3N_4$) having a width in a range of from about 10 nanometers to about 20 nanometers;

etching said pillar from said exposed middle portion of said top surface of said pillar down to a depth that is about ½ the height of said pillar to form said recess within said pillar; and etching away said first spacers and said second spacers;

C. depositing a gate dielectric material on any exposed surface of said semiconductor material of said pillar including at said top surface and said first and second side surfaces of said pillar and at said sidewalls and said bottom wall of said recess, for a gate length along said length of said pillar, wherein an effective drive current width of said field effect transistor is a total perimeter distance of said gate dielectric material on said top surface and said first and second side surfaces of said pillar and on said sidewalls and said bottom wall of said recess, and wherein said gate dielectric material is comprised of one of silicon dioxide ($SiO_2$) and silicon nitride ($Si_3N_4$) and a dielectric material having a dielectric constant that is higher than the dielectric constant of silicon dioxide ($SiO_2$);

D. depositing a gate electrode material on said gate dielectric material to surround said pillar at said top surface and said first and second side surfaces of said pillar and to fill said recess for said gate length of said pillar, wherein said gate electrode material is comprised of one of poly-silicon, poly-silicon germanium (SiGe), and a metal having a thickness in a range of from about 50 nanometers to about 200 nanometers; and E. implanting a drain and source dopant into exposed regions of said pillar to form a drain of said field effect transistor on a first side of said gate electrode material along said length of said pillar and to form a source of said field effect transistor on a second side of said gate electrode material along said length of said pillar;

wherein said drain and source dopant is an N-type dopant for fabrication of an NMOSFET (N-channel Metal Oxide Semiconductor Field Effect Transistor); and wherein said drain and source dopant is a P-type dopant for fabrication of a PMOSFET (P-channel Metal Oxide Semiconductor Field Effect Transistor).

* * * * *